United States Patent [19]

Kiyomura et al.

[11] Patent Number: 4,999,683
[45] Date of Patent: Mar. 12, 1991

[54] AVALANCHE BREAKDOWN SEMICONDUCTOR DEVICE

[75] Inventors: Akio Kiyomura, Sakado; Takayoshi Terashima, Saitama; Tohru Suzuki, Asaka, all of Japan

[73] Assignee: Sanken Electric Co., Ltd., Saitama, Japan

[21] Appl. No.: 458,398

[22] Filed: Dec. 28, 1989

[30] Foreign Application Priority Data

Dec. 30, 1988 [JP] Japan .................... 63-333952
Aug. 11, 1989 [JP] Japan .................... 1-208900

[51] Int. Cl.$^5$ .................... H01L 29/90; H01L 29/06; H01L 29/34
[52] U.S. Cl. .................... 357/13; 357/20; 357/38; 357/49; 357/52
[58] Field of Search .................... 357/13, 20, 30 A, 38, 357/49, 52

[56] References Cited

U.S. PATENT DOCUMENTS

| | | | |
|---|---|---|---|
| 4,071,852 | 1/1978 | Kannam | 357/13 |
| 4,271,445 | 6/1981 | Hartman et al. | 357/13 |
| 4,323,909 | 4/1982 | Valdmann | 357/13 |
| 4,451,839 | 5/1984 | Nelson | 357/13 |
| 4,607,274 | 8/1986 | Yoshitake | 357/13 |
| 4,797,720 | 1/1989 | Lindner et al. | 357/13 |
| 4,807,011 | 2/1989 | Nonaka et al. | 357/13 |

*Primary Examiner*—Andrew J. James
*Assistant Examiner*—Ngan Van Ngo
*Attorney, Agent, or Firm*—Woodcock, Washburn, Kurtz, Mackiewicz & Norris

[57] ABSTRACT

A Zener diode comprising a semiconductor substrate having an n-type region partly exposed at a main face of the substrate, a p$^+$-type region disposed contiguous to the n-type region and exposed at the main face of the semiconductor substrate, and an n$^+$-type region also exposed at the main face of the substrate and contiguously surrounded by the p$^+$-type region besides being contiguous to the p$^+$-type region. The arrangement of the semiconductor regions in relation to one another, and an an insulating layer on the main face of the substrate and to a pair of electrodes thereon, is such that the breakdown voltage is free from the influence of temperatures and of the ions contained in the insulating layer.

11 Claims, 7 Drawing Sheets

AVALANCHE BREAKDOWN SEMICONDUCTOR DEVICE

BACKGROUND OF THE INVENTION

Our invention relates to semiconductor devices in general and, in particular, to those known as Zener diodes or avalanche diodes operating on the principle of avalanche breakdown.

The Zener diode with its constant-voltage characteristic finds widespread use in a variety of electronic circuits such as those for producing reference voltage or for providing protective functions. One of the requirements for this type of diode is the constancy of the breakdown voltage. Breakdown should occur as far inside the semiconductor substrate of the diode as possible in order to make the breakdown voltage free from the influence of the insulating layer and the like on the semiconductor substrate.

Japanese Unexamined Patent Publication No. 57-71186 suggests a Zener diode (FIG. 1) explicitly designed for that purpose. This prior art diode was, however, unsatisfactory for the great temperature dependence of the breakdown voltage.

A diode has also been known (FIG. 2) which is practically free from the temperature dependence of the breakdown voltage. We also object to this second prior art device because its breakdown voltage is subject to fluctuations under the influence of the ions contained in the insulating layer and the plastic covering on the surface of the semiconductor substrate. We will later discuss in more detail the weaknesses of these prior art devices with reference to the drawings.

SUMMARY OF THE INVENTION

We have hereby invented how to construct an avalanche breakdown semiconductor device having a breakdown voltage that is low in temperature dependence and is practically unaffected by the ions contained in the insulating layer on the surface of the semiconductor substrate as well as in the plastic covering on the insulating layer.

Briefly, our invention may be summarized as an avalanche breakdown semiconductor device having a semiconductor substrate comprising a first region of a first conductivity type partly exposed at a main face of the semiconductor substrate, a second region of a second conductivity type, opposite to the first conductivity type, exposed at the main face of the semiconductor substrate and disposed contiguous to the first region, and at least one third region of the first conductivity type exposed at the main face of the semiconductor substrate and disposed contiguous to both the first and second regions so that the second and third regions provide therebetween a pn junction which is exposed at the main face of the semiconductor substrate. The third region is surrounded by the second region, as seen at the main face of the semiconductor substrate and is higher is impurity concentration than the first region.

Additionally, the diode comprises an insulating layer formed on the main face of the semiconductor substrate so as to cover the pn junction between the second and third regions and substantially all the surface of the third region exposed at the main face of the semiconductor substrate, a first electrode formed on the main face of the semiconductor substrate so as to cover all the exposed surface of the third region of the semiconductor substrate via the insulating layer and electrically connected to the second region of the semiconductor substrate, and a second electrode formed on the semiconductor substrate and electrically connected to the first region thereof.

Avalanche breakdown takes place between the second and third regions of the semiconductor substrate. The depletion layer due to the pn junction between the second and third regions is so thin that the temperature dependence of the breakdown voltage is negligibly small.

As an additional advantage, since the third region is surrounded by the second region, the deletion layer created by the field effect at the exposed surface portion of the third region is unaffected by the depletion layer at the surface portion of the first region. Accordingly, the depletion layer between the second and third regions remains unaffected despite possible variations in the thickness of the depletion layer due to the field effect, or of the depletion layer due to the interaction of the fit region and the insulating layer, under the influence of the ions contained in the insulating layer as well as in the plastic covering which is usually provided on the insulating layer.

The above and other features and advantages of our invention and the manner of realizing them will become more apparent, and the invention itself will best be understood, from a study of the following description and appended claims, with reference had to the attached drawings showing both the noted prior art devices and some preferred embodiments of our invention.

DETAILED DESCRIPTION

Figure 1:
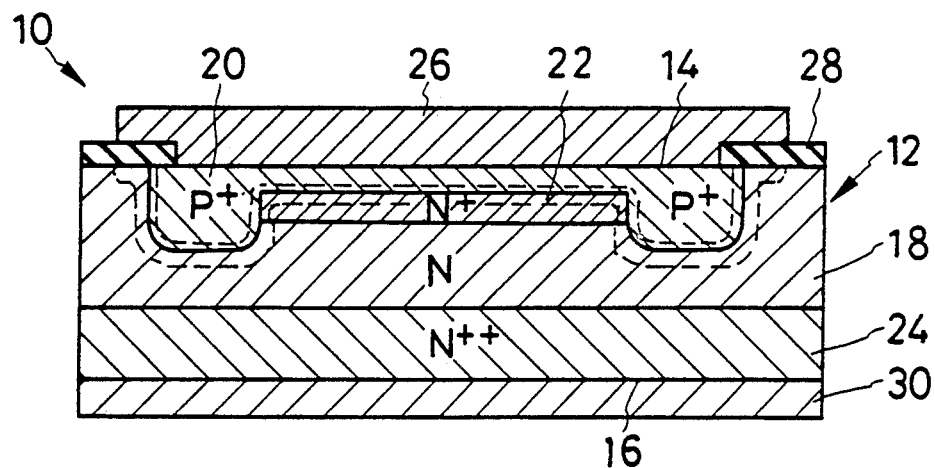
FIG. 1 is a section through a prior art Zener diode.

We consider it essential that some prior art diodes be shown and described in some more detail in order to make clear the problems left unsolved in the art. FIG. 1 show the Zener diode 10 suggested by Japanese Unexamined Patent Publication No. 57-71186. It has a semiconductor substrate 12 having a pair of opposite main faces 14 and 16. We will refer to the face 14 of the substrate 12 as the top face, it being shown directed upwardly, and to the other face 16 as the bottom face, for the convenience of disclosure. The same rule applies to all the other semiconductor devices to be disclosed subsequently.

The semiconductor substrate 12 has an n-type region 18 formed by the start material of the substrate, a $p^+$-type region 20 exposed at the top face 14 of the substrate, an $n^+$-type region 22 buried under the $p^+$-type region, and an $n^{++}$-type region 24 exposed at the bottom face of the substrate. An anode 26 is formed on the top face 14 of the substrate 12 via an insulating layer 28, and a cathode 30 on the bottom face 16 of the substrate. The anode 26 contacts the $p^+$-type region 20 through an aperture in an insulating layer 28.

This known construction, featuring the buried $n^+$-type region 22, makes it possible for breakdown to occur so deep inside the semiconductor substrate that the breakdown voltage is unaffected by the ions that will be unavoidably contained in the insulating layer 28 and in a plastic covering, not shown, which is usually formed on the insulating layer. This advantage is offset, however, by the difficulty of making the breakdown voltage of the diode 10 free from temperatures because of the buried $n^+$-type region 22.

As has been known heretofore, the temperature dependence of the breakdown voltage is reducible by so arranging the p- and n-type regions of the semiconductor substrate that the depletion layer due to the resulting pn junction is partly reduced in thickness. Breakdown will then occur at this thin part of the depletion layer. The buried $n^+$-type region 22 of the prior art diode 10 has made it difficult to create a deletion layer having such thin part.

Figure 2:
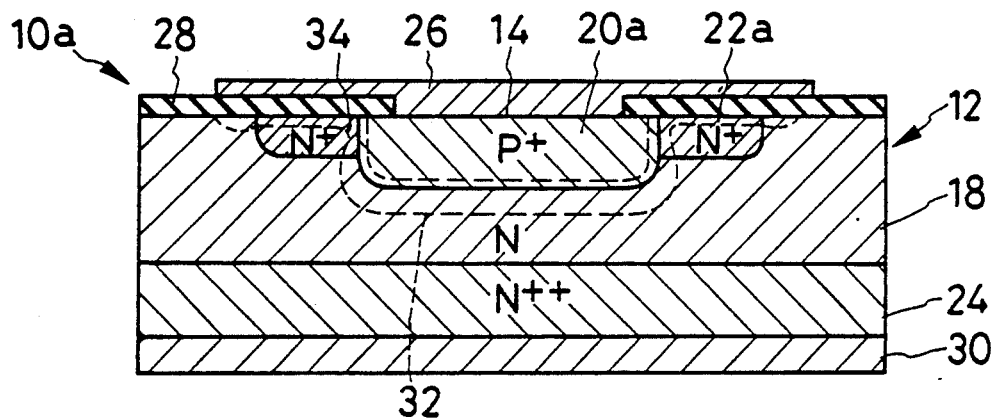
FIG. 2 is a section through another prior art Zener diode.

FIG. 2 shows another known Zener diode 10a constructed on the above explained principle of reducing the temperature dependence of the breakdown voltage. This second prior art device 10a differs from the first 10 in having an annular $n^+$-type region 22a surrounding a $p^+$-type region 20a and exposed at the top face 14 of the semiconductor substrate 12. Also, in this diode 10a, part of the anode 26 overlies the $n^+$-type region 22a via the insulating layer 28.

Consequently, as indicated by the dashed line designated 32, a depletion layer is created not only by the pn junction but also by the field effect. Being related to impurity concentrations, the depletion layer 32 is generally thicker at the n-type region 18 of low impurity concentration and thinner at the $n^+$-type region 22a of high impurity concentration. The impurity concentration of the $n^+$-type region 22a grows less as it extends away from the top face 14 of the substrate 12. Therefore, that part of the depletion layer 32 which is created by the pn junction between the regions 20a and 22a becomes thin at its zone immediately below the substrate top face 14, as indicated by the numeral 34. Breakdown occurs at this thin annular zone 34 of the deletion layer 32.

It will also be noted from FIG. 2 that $p^+$-type region 20a is deeper than the surrounding $n^+$-type region 22a. For this reason the depletion layer 32 becomes abruptly thicker under the $n^+$-type region 22a, serving to exaggerate its thin annular zone 34.

Thus the breakdown voltage of this second prior art diode 10a is less temperature dependent than that of the first prior art diode 10 as breakdown occurs at the thin annular zone 34 of the depletion layer 32 inside the semiconductor substrate 12. However, the depletion layer created adjacent the top face of the n-type region 18 by the field effect provided by the combination of the n-type region 18, anode 26 and insulating layer 28 has been susceptible to variations under the influence of the ions contained in the insulating layer 28 and in the unshown plastic covering thereon. The result has been fluctuations in breakdown voltage, particularly when the diode is reverse biased at elevated temperatures.

FIRST EMBODIMENT OF THE INVENTION

Figure 3:
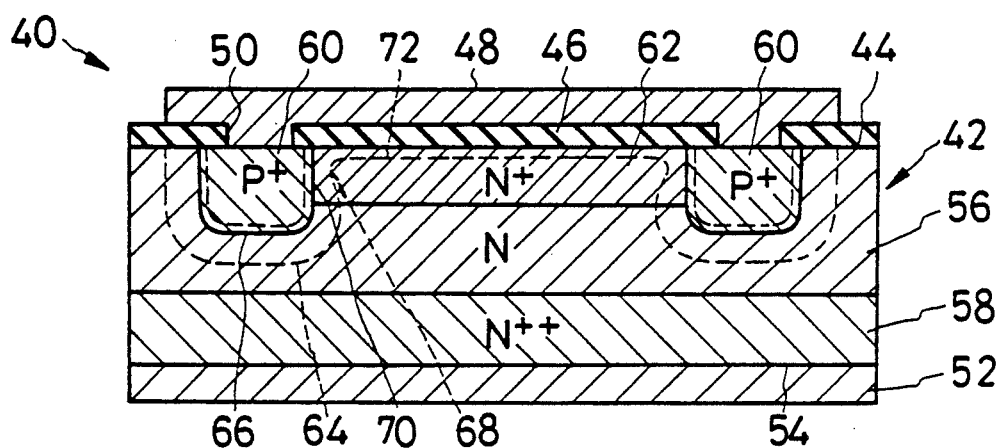
FIG. 3 is a section through a preferred form of Zener diode constructed in accordance with our invention, the section being taken along the line III—III in FIG. 4.
Figure 4:
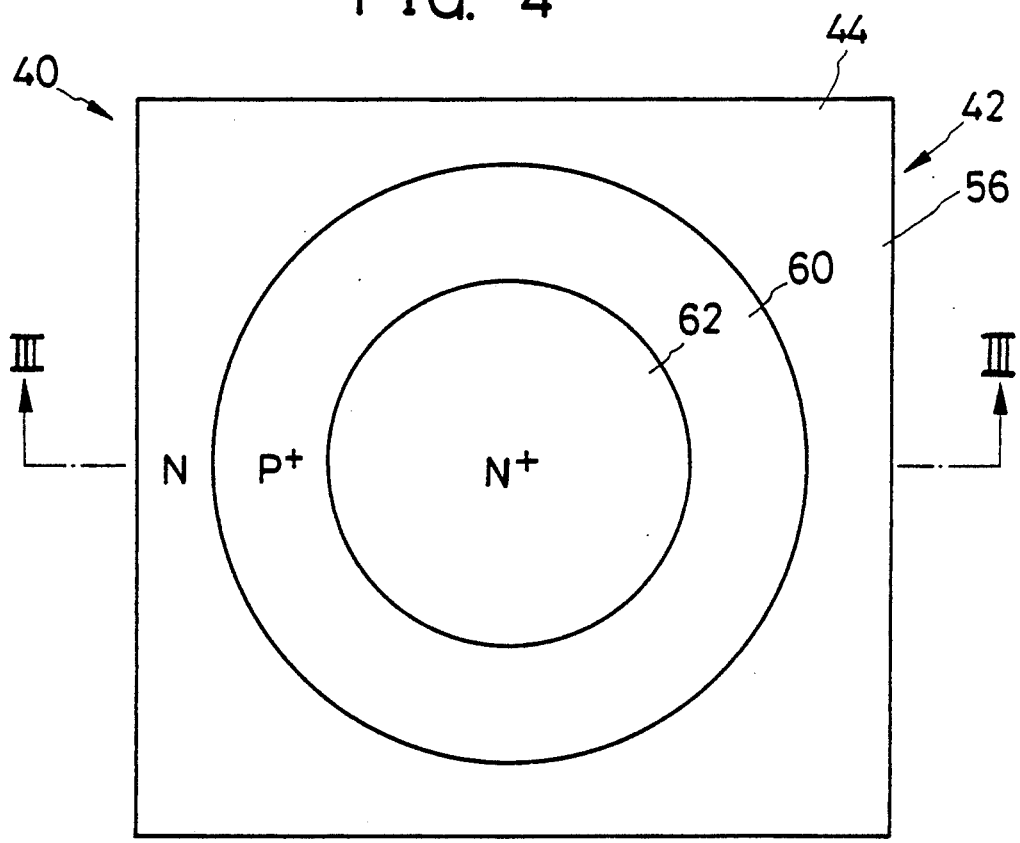
FIG. 4 is a plan of the semiconductor substrate of the diode of FIG. 3.

The improved Zener diode of our invention is shown in terms of its first preferred form in FIGS. 3 and 4 and therein generally designated 40. The diode 40 has a semiconductor (e.g. silicon) substrate 42 of boxlike shape, which is square as seen in a plan view as in FIG. 4. Formed on the top face 44 of the substrate 42 are an insulating layer 46 and, thereon, an anode 48 contacting the substrate through an annular aperture 50 in the insulating layer. A cathode 52 is formed on the bottom face 54 of the substrate 42. Typically, the insulating layer 46 is of silicon oxide; the anode 48 is of aluminum; and the cathode 52 is of nickel.

The semiconductor substrate 42 comprises: (a) a n-type region 56 provided by the start material (silicon) of the substrate and exposed in part at the top face 44 of the substrate; (b) an $n^{++}$-type region 58 underlying the n-type region and wholly exposed at the bottom face 54 of the substrate for the ohmic contact with the cathode 52; (c) a $p^+$-type region 60 formed in the n-type region 56 and exposed at the top face 44 of the substrate; and (d) an $n^+$-type region 62 formed in the n-type region 56 and exposed at the top face 44 of the substrate. As seen in a plan view as in FIG. 4, the $p^+$-type region 60 is annular in shape and concentrically surrounds the $n^+$-type region 62 of circular shape in this particular embodiment.

The $n^+$-type region 62 is higher in impurity concentration than the underlying n-type region 56. The impurity concentration of the $n^+$-type region 62 may be appropriately determined depending upon the desired avalanche breakdown voltage. Generally speaking, we recommend that the impurity concentration of the $n^+$-type region 62 be at least five, preferably at least ten, times that of the n-type region 56, in order to cause this region 62 to perform its intended functions to the full.

It is also important that the $n^+$-type region 62 gradually decrease in impurity concentration from its exposed top surface toward its bottom. Such gradient in impurity concentration can be realized by forming the $n^+$-type region 62 by thermally driving the predeposition of impurity ions. The depth of the $n^+$-type region 62 should be not more than one half, preferably one third, of that of the surrounding $p^+$-type region 60. Both $n^{++}$-type region 58 and $p^+$-type region 60 can be formed by the familiar impurity diffusion technique.

The insulating layer 46 thoroughly covers the exposed top surfaces of the n-type region 56 and the $n^+$-type region 62 but is annularly apertured at 50 to permit the anode 48 to contact the annular p+-type region 60. It will be noted that the insulating layer 46 extends onto the exposed top surface of the p+-type region 60 beyond its boundaries with the n-type region 56 and with the n+-type region 62. Also, the anode 48 overlies all of the n+-type region 62 and the p+-type region 60 and has its periphery disposed over the exposed top surface of the n-type region 56 ia the insulating layer 46. That annular peripheral part of the anode 48 which overlies the exposed top surface of the n-type region 56 functions as the known field plate to improve the voltage-withstanding capability of the outer boundary of the p+-type region 60.

OPERATION OF THE FIRST EMBODIMENT

Let us suppose that a reverse voltage is impressed between the anode 48 and cathode 52 of this Zener diode 40. Then, as indicated by the dashed lines in FIG. 3, a first depletion layer 64 will be created due to the first pn junction 66 between n-type region 56 and p+-type region 60; a second depletion layer 68 due to the second pn junction 70 between p+-type region 60 and n+-type region 62; and a third depletion layer 72 due to the field effect of the anode 48. Of course, we individually identified the three depletion layers 64, 68 and 72 for the purpose of illustration only; actually, they will merge into a unitary whole.

We have stated that the n+-type region 62 decreases in impurity concentration from its exposed top surface toward is bottom. Consequently, the second depletion layer 68 becomes thinner toward the top face 44 of the substrate 42. However, because of the presence of the third depletion layer 72 just under the substrate top face 44, the thinnest part of the second depletion layer 68, or of the complete depletion layer constituted of the layers 64, 68 and 72, is somewhat spaced from the substrate top face 44.

Thus, with an increase in reverse voltage, avalanche breakdown will eventually take place in the thinnest part of the second depletion layer 68 as the field concentrates there beyond the critical intensity. We understand that the diameter of the n+-type region 62 is so determined that it does not filled up with the depletion layers 68 and 72. Therefore, when breakdown occurs, the reverse current will flow through the path comprising the cathode 52, n++-type region 58, n-type region 56, n+-type region 62, the thinnest part of the second depletion layer 68, p+-type region 60, and anode 48.

Figure 5:
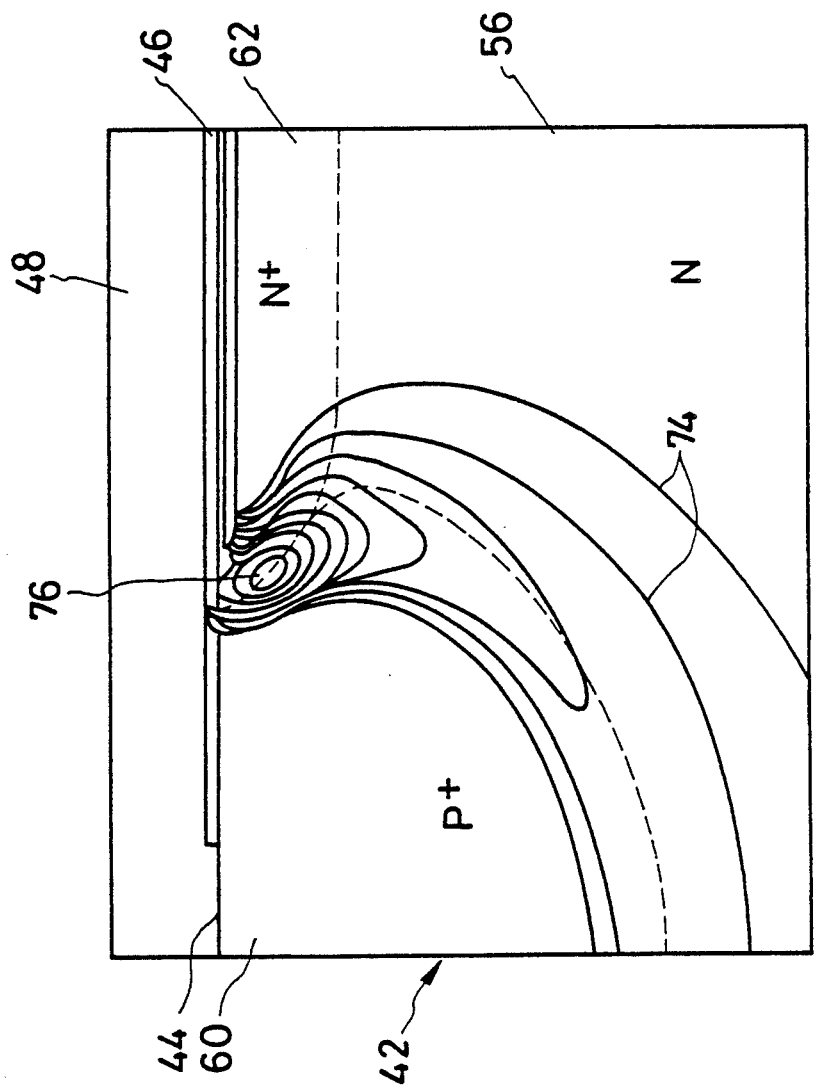
FIG. 5 is a diagrammatic illustration of the distribution of field intensity at and adjacent the interfaces among the n-, p+- and n+-type regions of the semiconductor substrate in the diode of FIG. 3.

We have illustrated in FIG. 5 the distribution of field intensity at the adjacent the thinnest part of the second deletion layer 68 at the time of avalanche breakdown. The broken lines in this figure represent the boundaries between the semiconductor regions 56, 60 and 62, and the solid lines 74 represent the equipotential lines. The field intensity grows higher from the outer toward the inner ones of the equipotential lines 74. The breakdown voltage is not to fluctuate as breakdown occurs at the zone 76 of the highest field intensity which is spaced inwardly or downwardly from the top face 44 of the substrate 42.

The Zener diode 40 gains several other advantages over the prior art devices of FIGS. 1 and 2. As will be seen by referring again to FIG. 3, the thickness of the second depletion layer 68 due to the pn junction 70 between the regions 60 and 62 is unaffected by the depletion layer created by the insulating layer 46, anode 48 and n-type region 56 because the n+-type region 62 is surrounded by the annular p+-type region 60. Accordingly, the thickness of the second depletion layer 68 remains unchanged in the face of the possible variations of the depletion layer at and adjacent the exposed top surface of the n-type region 56 by reason of the ions contained in the insulating layer 46 or in the unshown plastic covering thereon. Fluctuations in breakdown voltage are reduced for this reason, too.

Another advantage is that the temperature dependence of the breakdown voltage of the Zener diode 40 is much less than that of the prior art device 10 of FIG. 1. This is because only a thin depletion layer is created across the path of reverse current through the zone 76 of the highest field intensity where breakdown takes place.

As an additional advantage, the n+-type region 62 has its top surface thoroughly covered not only by the insulating layer 46 but also by the anode 48, with the consequent enhancement of the reliability of operation. Experiment has proved that the diode 40 with the insulating layer 46 of silicon oxide, which is easy to fabricate, and the anode 48 thereon is just as reliable in operation as the prior art devices having two laminated insulating layers of silicon oxide and silicon nitride or phosphor silicate glass.

SECOND EMBODIMENT

Figure 6:
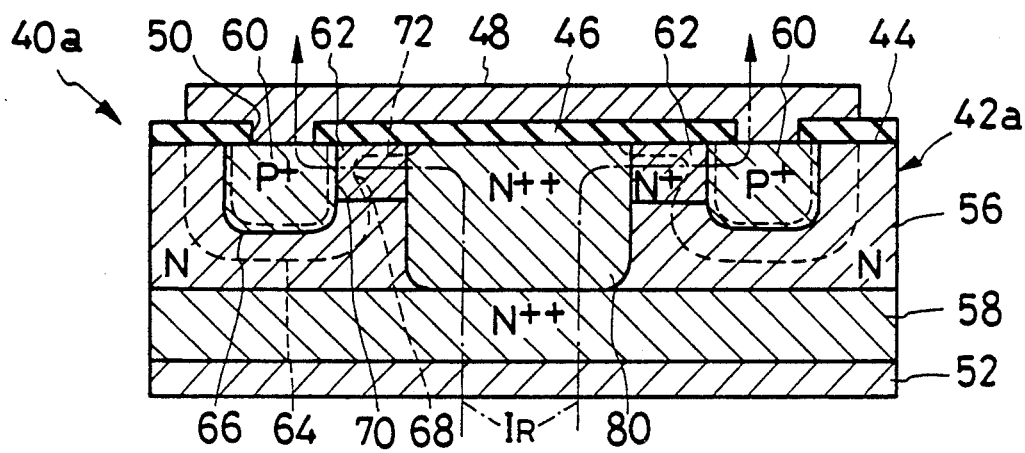
FIG. 6 is a section through another preferred form of Zener diode in accordance with our invention, the section being taken along the line VI—VI in FIG. 7.
Figure 7:
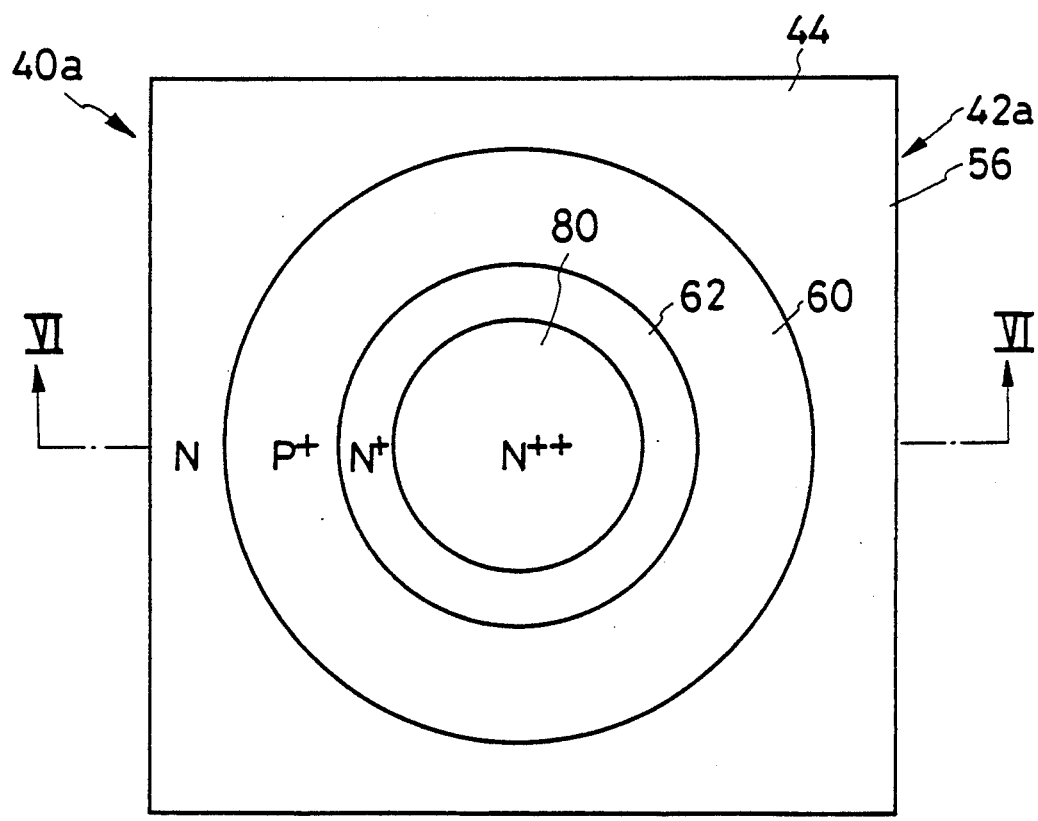
FIG. 7 is a plan of the semiconductor substrate of the diode of FIG. 6.

The second preferred form of Zener diode 40a shown in FIGS. 6 and 7 differs from the FIGS. 3 and 4 diode 40 in having an n++-type region 80 of columnar shape in its semiconductor substrate 42a. All the other regions of this substrate 42a are arranged just like those of the substrate 42 of the diode 40, and all the other details of construction of this diode 40a are analogous with those of the diode 40.

Thus, disposed centrally of the substrate 42a, the n++-type region 80 is exposed at its top face 44 and is contiguous to all of the n-type region 56, n++-type region 58 and n+-type region 62. The exposed top surface of the n++-type region 80 is covered by the insulating layer 46 of silicon oxide. The n++-type region 80 may be formed by the diffusion of impurities in the n-type region 56 prior to the formation of the p+-type region 60 and n+-type region 62. The impurity concentration of the n++-type region 80 is higher than those of the n-type region 56 and n+-type region 62.

The n+-type region 62 and the n++-type region 80 are akin in being an n-type region of high impurity concentration. These regions 62 and 80 may therefore be thought of as being two subregions of the same conductivity-type region.

OPERATION OF THE SECOND EMBODIMENT

The application of a reverse voltage to the Zener diode 40a results in the creation of the depletion layers 64, 68 and 72, as has been set forth in connection with the FIGS. 3 and 4 diode 40. However, since the n+-type region 62 is annular in shape and surrounds the n++-type region 80 in this diode 40a, the third depletion layer 72 due to the field effect of the anode 48 is formed substantially in only the annular n+-type region 62. The high impurity concentration of the n++-type region 80 substantially prevents the formation of a depletion layer therein, although a depletion layer will be somewhat created therein if its impurity concentration is close to that of the surrounding n+-type region 62.

In this diode 40a, too, the thinnest part of the depletion layers 64, 68 and 72 is located at the n+-type region 62 and is spaced from the top face 44 of the semiconductor substrate 42a. Breakdown occurs at this annular thinnest part of the depletion layers as the field intensity becomes highest there upon application of a reverse voltage between anode 48 and cathode 52.

We have indicated the path of reverse current $I_R$ through the diode 40a. The n+-type region 62, where breakdown occurs, is contiguous to the n++-type region 80 of higher impurity concentration, which in turn is contiguous to the other n++-type region 58 of equally high impurity concentration. Accordingly, the reverse current $I_R$ flows through the path comprising the cathode 52, n++-type region 58, n++-type region 80, n+-type region 62, p+-type region 60 and anode 48.

The diode 40a offers the advantage of lower resistance to the flow of the reverse current $I_R$ in the avalanche breakdown region than in the FIGS. 3 and 4 diode 40. The lower resistance is due to the presence of the n++-type region 80 in the flow path of the reverse current. Of course, the diode 40a possesses all the advantages that have been listed in connection with the diode 40.

THIRD EMBODIMENT

Figure 8:
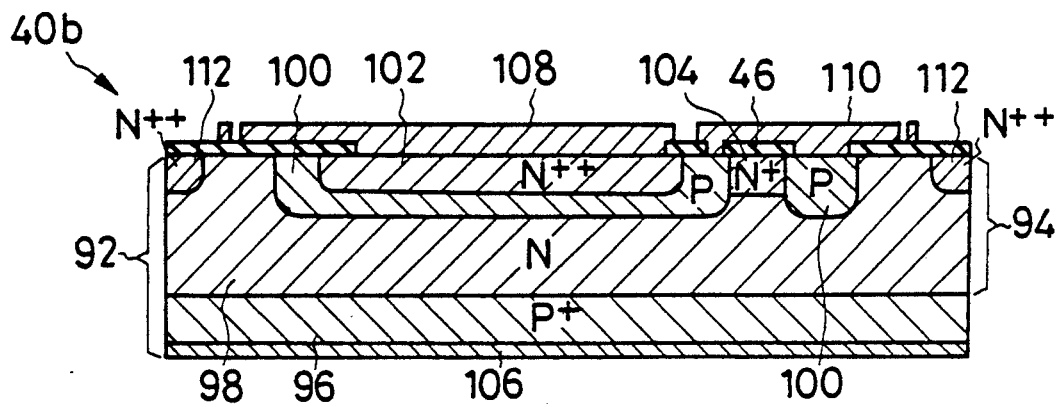
FIG. 8 is a section through a diode-thyristor complex representing a further preferred embodiment of our invention.

In FIG. 8 we have shown the Zener diode of our invention as adapted for use in or with an overvoltage thyristor. Generally designated 40b, the diode-thyristor complex has a semiconductor substrate divided into several regions constituting a thyristor section 92 and a diode section 94. The thyristor section 92 is constituted of a p+-type region 96, an n-type region 98, a p-type region 100 and an n++-type region 102. The diode section 94 is constituted of the n-type region 98, the p-type region 100 and an n+-type region 104. The thyristor section 92 additionally comprises an anode 106 on the bottom face of the substrate, and a cathode 108 and a gate 110 on the top face of the substrate. The anode 106 and gate 110 of the thyristor section 92 serve also as the cathode and anode, respectively, of the diode section 94.

The n-type region 98 of the diode-thyristor complex 40b corresponds to the n-type region 56 of the FIGS. 3 and 4 diode 40; the p-type region 100 to the p+-type region 60; and the n+-type region 104 to the n+-type region 62. The n+-type region 104 is surrounded by the p-type region 100. As has been pointed out in connection with the regions 62 and 56 of the diode 40, the impurity concentration of the n-type region 104 should be at least five, preferably at least ten, times that of the n-type region 98.

The diode-thyristor complex 40b additionally includes an n++-type region 112 extending along the periphery of the top face of the semiconductor substrate in order to prevent the expansion of the opposite conductivity type region on the surface of the n-type region 98. The insulating layer 46 thoroughly covers the top surfaces of the n-type region 98 and n+-type region 104, as in the FIGS. 3 and 4 diode 40.

Figure 9:
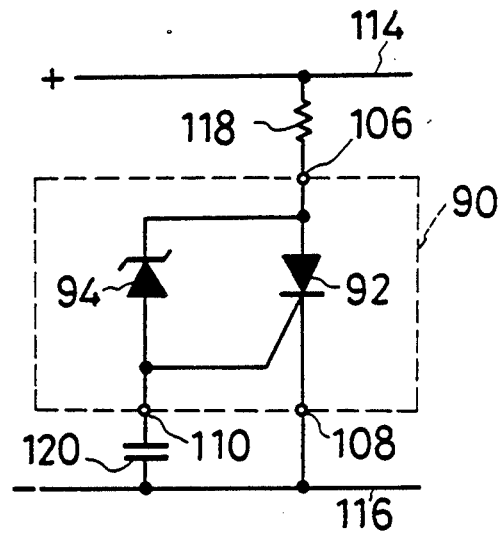
FIG. 9 is a diagram of an electric circuit equivalent to the diode-thyristor complex of FIG. 8.

FIG. 9 is a schematic diagram of the electric circuit equivalent to the diode-thyristor complex 40b. The diode 94 is connected between the anode 106 and gate 110 of the thyristor 92.

FIG. 9 also shows the diode-thyristor complex 40b connected between a pair of direct-current supply lines 114 and 116 by way of illustration of one possible application thereof. The anode 106 is connected to the positive supply line 114 via a resistor 118. The cathode 108 is connected directly to the negative supply line 116, to which the gate 110 is also connected via a capacitor 120.

The diode 94 will break down when a transient overvoltage develops between the pair of supply lines 114 and 116, causing a current flow through the path comprising the diode 94 and capacitor 120. When a sustained overvoltage appears, on the other hand, the thyristor 92 will become conductive after the breakdown of the diode 94. The current will then flow through the thyristor 92.

FOURTH EMBODIMENT

Figure 10:
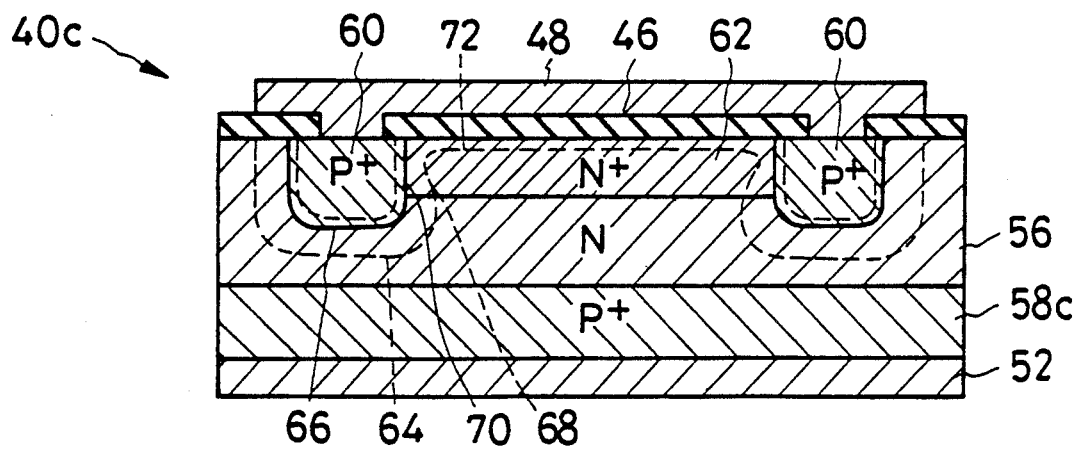
FIG. 10 is a section through a further preferred form of Zener diode in accordance with our invention.

FIG. 10 shows a pnp semiconductor device 40c which differs from the FIGS. 3 and 4 device 40 only in that a p+-type region 58c is employed in place of the n++-type region 58. This device 40c gains the same advantage as the device 40.

FIFTH EMBODIMENT

Figure 11:
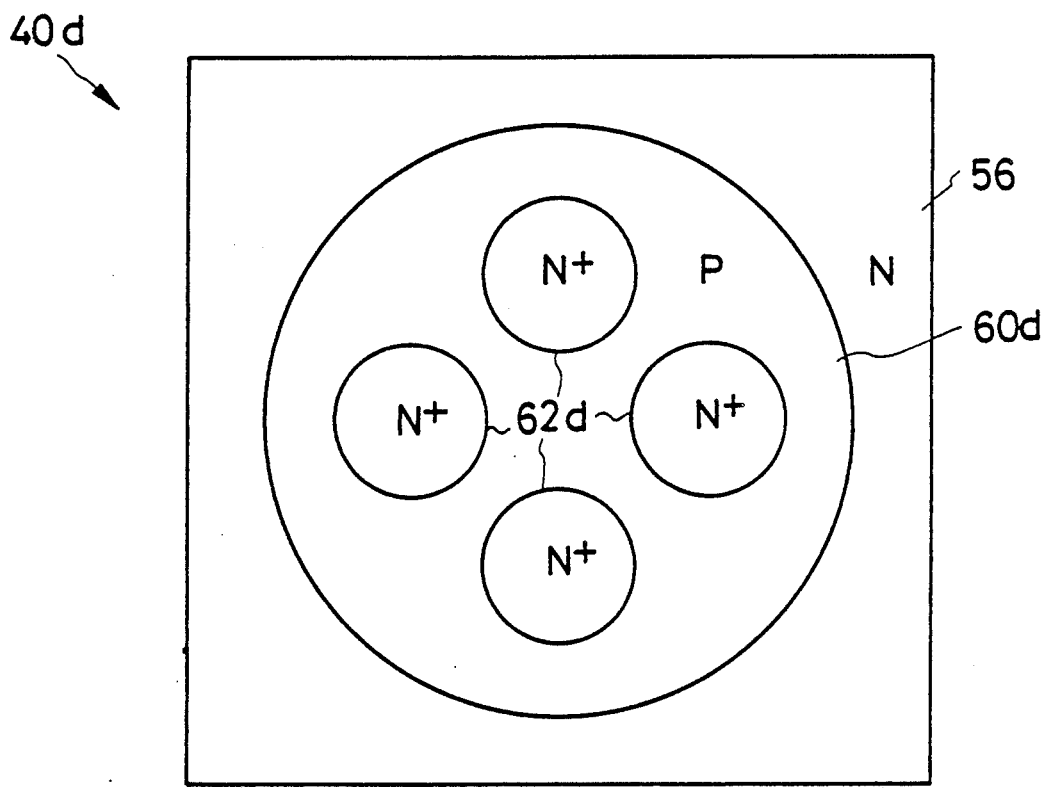
FIG. 11 is a plan of a modified semiconductor substrate in accordance with our invention.

FIG. 11 shows another slight modification of the FIGS. 3 and 4 device 40. The modified diode 40d has a plurality of, four in this embodiment, n+-type regions 62d, instead of but one such region 62 of the FIGS. 3 and 4 diode 40. All the n+-type regions 62d are formed in a p+-type region 60d, which is circular in shape as seen in a plan view as in this figure, instead of being annular like the p+-type region 60 of the diode 40. This diode 40d also gains the same advantages as the diode 40.

SIXTH EMBODIMENT

Figure 12:
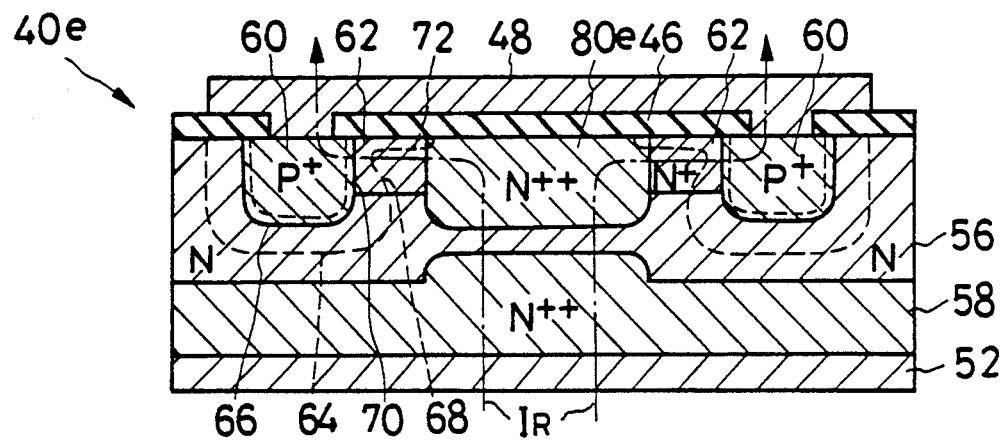
FIG. 12 is a section through a further preferred form of Zener diode in accordance with our invention.

The diode 40e shown in FIG. 12 represents a slight modification of the FIGS. 6 and 7 diode 40a. This modified diode 40e features an n++-type region 80e which is out of contact with the n++-type region 58. Essentially, such a region of high impurity concentration (low resistivity) may be provided in at least part of the path of the reverse current $I_R$ in order to obtain the advantages indicated in connection with the diode 40a. FIG. 12 also shows the n++-type region 58 as protruding toward the n++-type region 80e.

SEVENTH EMBODIMENT

Figure 13:
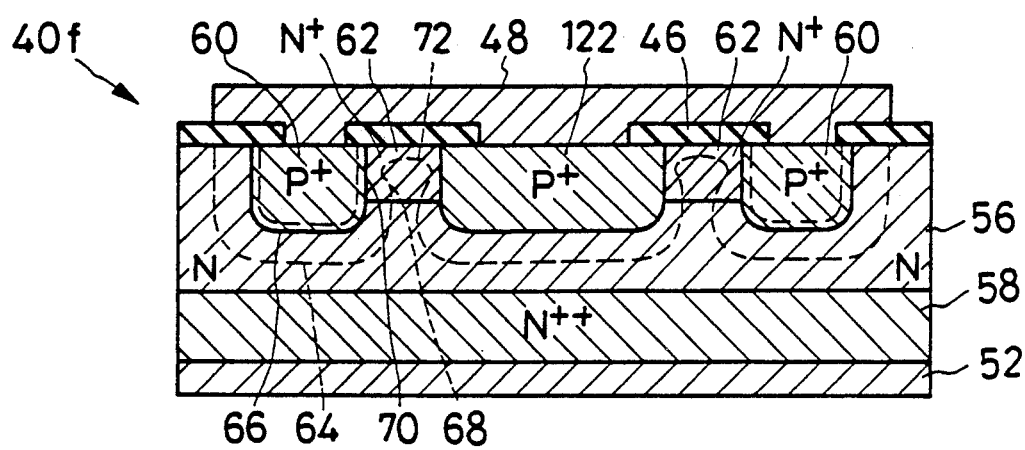
FIG. 13 is a section through a further preferred form of Zener diode in accordance with our invention.
Figure 14:
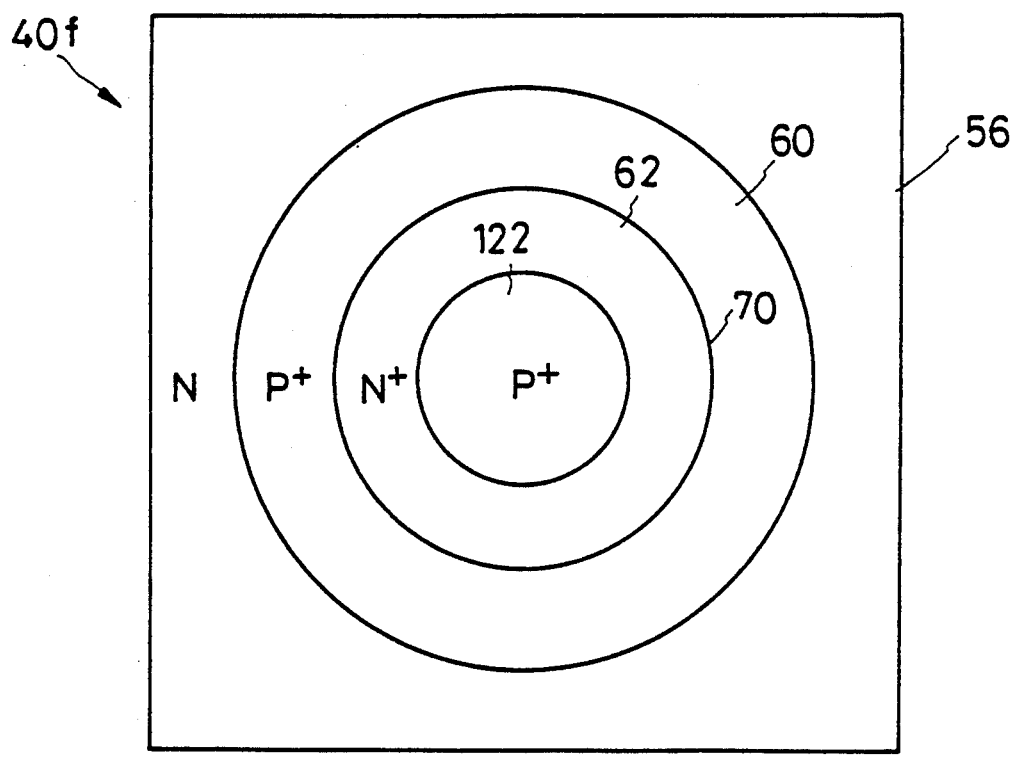
FIG. 14 is a plan of the semiconductor substrate of the diode of FIG. 13.

The diode 40f of FIGS. 13 and 14 is equivalent to the FIG. 12 diode 40e except that the n++-type region 80e of the latter is replaced by a p+-type region 122. The anode 48 contacts both p+-type regions 60 and 122. As the depletion layers 64, 68 and 72 are created as indicated by the broken lines in FIG. 13, the diode 40f offers essentially the same advantages as does the FIGS. 3 and 4 diode 40.

POSSIBLE MODIFICATIONS

Although we have show and described our invention in terms of several preferable embodiments thereof, we do not wish our invention to be limited by the exact details of such disclosure. The following, then, is a brief list of possible modifications or alterations of the illustrated embodiments which we believe all fall within the scope of our invention:

1. The anode 48 of the FIGS. 3 and 4 device 40 need not overlie the entire n+-type region 62, although the illustrated construction is preferable for effectively preventing the fluctuation or creeping of the breakdown voltage.

2. In the FIGS. 6 and 7 device 40a, too, the anode 48 need not overlie the entire n++-type region 80 if the impurity concentration of this region is so high as to substantially exclude the third depletion layer therefrom. However, the anode must be formed all over the region 80 if its impurity concentration is so low as to permit the third depletion layer to be created substantially throughout its top surface portion.

3. The n+-type region 62 could be formed so deep as to contact the n++-type region 58 in the FIGS. 3 and 4 device 40 in order to decrease resistance to the flow of reverse current in the avalanche breakdown region. The illustrated construction of the device 40 is preferred for the efficient production of Zener diodes having a desired breakdown voltage. The illustrated construction of the FIGS. 6 and 7 device 40a is particularly recommended both for obtaining a desired breakdown voltage and for reducing resistance to the flow of reverse current.

4. The n++-type region 80 could be approximately equal in impurity concentration to the n+-type region 62 in the FIGS. 6 and 7 device 40a, although the resulting advantages would then be less pronounced.

What We claim is:

1. An avalanche breakdown semiconductor device comprising:
   (a) a semiconductor substrate [42] having a main face [44] and comprising:
      (1) a first region [56] of a first conductivity type partly exposed at the main face of the semiconductor substrate;
      (2) a second region [60] of a second conductivity type, opposite to the first conductivity type, exposed at the main face of the semiconductor substrate and disposed contiguous to the first region; and
      (3) at least one third region [62] of the first conductivity type exposed at the main face of the semiconductor substrate and disposed contiguous to both the first and second regions so that the second and third regions provide therebetween a pn junction which is exposed at the main face of the semiconductor substrate, the third region being surrounded by the second region, as seen at the main face of the semiconductor substrate, and being higher in impurity concentration than the first region;
   (b) an insulating layer [46] formed on the main face of the semiconductor substrate so as to cover the pn junction between the second and third regions and substantially all the surface of the third region exposed at the main face of the semiconductor substrate;
   (c) a first electrode [48] formed on the main surface of the insulating layer so as to cover substantially all the exposed surface of the third region of the semiconductor substrate via the insulating layer and electrically connected to the second region of the semiconductor substrate; and
   (d) a second electrode [52] formed on the face opposite to the main face of the semiconductor substrate and electrically connected to the first region thereof.

2. The avalanche breakdown semiconductor device of claim 1 wherein the semiconductor substrate further comprises a fourth region [58] of the first conductivity type disposed contiguous to the first region [56] and being higher in impurity concentration than the first region, the second electrode being electrically connected to the first region via the fourth region.

3. The avalanche breakdown semiconductor device of claim 1 wherein the third region of the semiconductor substrate comprises:
   (a) a first subregion [62] contiguously surrounded by the second region [60]; and
   (b) a second subregion [80] contiguously surrounded by the first subregion and extending into the semiconductor substrate deeper from the main face thereof than the first subregion.

4. The avalanche breakdown semiconductor device of claim 3 wherein the second subregion [80] of the third region of the semiconductor substrate is higher in impurity concentration than the first subregion [62] thereof.

5. The avalanche breakdown semiconductor device of claim 3 wherein the semiconductor substrate further comprises a fourth region [58] of the first conductivity type disposed contiguous to the first region [56] and to the second subregion [80] of the third region and being higher in impurity concentration than the first region, the second electrode being electrically connected to the first region via the fourth region.

6. The avalanche breakdown semiconductor device of claim 1 wherein the second region [60] extends deeper into the semiconductor substrate from the main face thereof than does the third region [62].

7. The avalanche breakdown semiconductor device of claim 1 wherein the semiconductor substrate further comprises a fourth region [58c] of the second conductivity type disposed contiguous to the first region [56], the second electrode being electrically connected to the first region via the fourth region.

8. The avalanche breakdown semiconductor device of claim 1 wherein, as seen at the main face of the semiconductor substrate, the third region [62] of the semiconductor substrate is circular in shape and is concentrically surrounded by the second region [60] of annular shape.

9. The avalanche breakdown semiconductor device of claim 1 wherein, as seen at the main face of the semiconductor substrate, the third region [62] of the semiconductor substrate is annular in shape, concentrically surrounded by the second region [60] of annular shape and concentrically surrounding another second region [122].

10. An avalanche breakdown semiconductor device comprising:
    (a) a semiconductor substrate having a main face and comprising:
       (1) a first region [98] of a first conductivity type partly exposed at the main face of the semiconductor substrate;
       (2) a second region [100] of a second conductivity type, opposite to the first conductivity type, exposed at the main face of the semiconductor substrate and disposed contiguous to the first region;
       (3) a third region [104] of the first conductivity type exposed at the main face of the semiconductor substrate and disposed contiguous to both the first and second regions so that the second and third regions provide therebetween a pn junction which is exposed at the main face of the semiconductor substrate the third region being surrounded by the second region, as seen at the main face of the semiconductor substrate, and being higher in impurity concentration than the first region;
       (4) a fourth region [96] of the second conductivity type disposed contiguous to the first region; and (5) a fifth region [102] of the first conductivity type contiguously surrounded by the second region and exposed at the main face of the semiconductor substrate;

(b) an insulating layer [46] formed on the main face of the semiconductor substrate so as to cover the pn junction between the second and third regions and substantially all the surface of the third region exposed at the main face of the semiconductor substrate;

(c) a first main electrode [108] electrically connected to the fifth region o the semiconductor substrate;

(d) a second electrode [106] electrically connected to the fourth region of the semiconductor substrate; and (e) a gate electrode [110] formed on the surface of the insulating layer so as to cover substantially all the exposed surface of the third region of the semiconductor substrate and electrically connected to the second region of the semiconductor substrate.

11. An avalanche breakdown semiconductor device comprising:

(a) a semiconductor substrate [42a] having a main face [44] and comprising:

(1) a first region [56] of a first conductivity type partly exposed at the main face of the semiconductor substrate;

(2) a second region [60] of a second conductivity type, opposite to the first conductivity type, exposed at the main face of the semiconductor substrate and disposed contiguous to the first region; and (3) at least one third region of the first conductivity type exposed at the main face of the semiconductor substrate and disposed contiguous to both the first and second regions so that the second and third regions provide therebetween a pn junction which is exposed at the main face of the semiconductor substrate, the third region being surrounded by the second region, as seen at the main face of the semiconductor substrate, and being higher in impurity concentration than the first region, the third region comprising a first subregion [62] contiguously surrounded by the second region [60] and a second subregion [80] contiguously surrounded by the first subregion and being higher in impurity concentration that the first subregion [62] thereof;

(b) an insulating layer [46] formed on the main face of the semiconductor substrate so as to cover the pn junction between the second and third regions and substantially all the surface of the third region exposed at the main face of the semiconductor substrate;

(c) a first electrode [48]]formed on the surface of the insulating layer so as to cover substantially all the exposed surface of the first subregion [62] and electrically connected to the second region of the semiconductor substrate; and (d) a second electrode [52] formed on the face opposite the main face of the semiconductor substrate and electrically connected to the first region thereof.

* * * * *